United States Patent
Oh

(10) Patent No.: US 9,000,342 B2
(45) Date of Patent: Apr. 7, 2015

(54) PASSIVE TYPE IMAGE SENSOR AND METHOD INCLUDING FIRST AND SECOND ANTI-BLOOMING TRANSISTORS DISCHARGING ELECTRIC CHARGES WHILE INTEGRATING ELECTRIC CHARGES

(75) Inventor: Hack-Soo Oh, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 647 days.

(21) Appl. No.: 13/102,358

(22) Filed: May 6, 2011

(65) Prior Publication Data
US 2012/0037788 A1 Feb. 16, 2012

(30) Foreign Application Priority Data

Aug. 16, 2010 (KR) .................. 10-2010-0078962

(51) Int. Cl.
*H01L 27/00* (2006.01)
*H01J 40/14* (2006.01)
*H01L 27/146* (2006.01)

(52) U.S. Cl.
CPC .... *H01L 27/14612* (2013.01); *H01L 27/14641* (2013.01); *H01L 27/14645* (2013.01)

(58) Field of Classification Search
USPC ..... 250/214.1, 214 R, 214 A, 214 LS, 214 C, 250/214 SW, 214 LA, 208.1; 330/2, 3, 9, 84, 330/85, 91, 126, 250; 348/307–309, 348/300–303; 257/290–293, 297
See application file for complete search history.

(56) References Cited

U.S. PATENT DOCUMENTS

| | | | |
|---|---|---|---|
| 7,282,685 B2 | 10/2007 | Boemler | |
| 7,476,836 B2 | 1/2009 | Boemler | |
| 8,456,559 B2 * | 6/2013 | Yamashita et al. | 348/308 |
| 2007/0040922 A1 | 2/2007 | McKee et al. | |
| 2009/0166515 A1 | 7/2009 | Boemler | |
| 2009/0201396 A1 | 8/2009 | Yu et al. | |
| 2009/0256060 A1 * | 10/2009 | Meynants et al. | 250/208.1 |

FOREIGN PATENT DOCUMENTS

| | | |
|---|---|---|
| KR | 10-2007-0118299 A | 12/2007 |
| KR | 10-2008-0037109 A | 4/2008 |
| KR | 10-2009-0086797 A | 8/2009 |

* cited by examiner

*Primary Examiner* — Georgia Y Epps
*Assistant Examiner* — Don Williams
(74) *Attorney, Agent, or Firm* — Sherr & Jiang, PLLC

(57) ABSTRACT

A passive type image sensor and a method for operating the same. The passive type image sensor includes a photoelectric conversion section configured to receive light and integrate electric charges; a transfer section configured to transmit the integrated electric charges; an output section configured to received integrated electric charges from the transfer section and amplify and output the amplified electric charges; and an electric charge discharging section configured to discharge the electric charges flowing from the photoelectric conversion section to a common node through the transfer section while integrating the electric charge integration in the photoelectric conversion section.

18 Claims, 7 Drawing Sheets

PASSIVE TYPE IMAGE SENSOR AND METHOD INCLUDING FIRST AND SECOND ANTI-BLOOMING TRANSISTORS DISCHARGING ELECTRIC CHARGES WHILE INTEGRATING ELECTRIC CHARGES

The present application claims priority to Korean Patent Application No. 10-2010-0078962 (filed on Aug. 16, 2010) which hereby incorporated by reference in its entirety.

BACKGROUND

An image sensor may sense light emitted from a subject and convert the sensed light to an electrical value. The image sensors may be classified as charge coupled device (CCDs) image sensors and complementary metal oxide semiconductor (CMOS) image sensors.

The CCD image sensor may include MOS capacitors that store and transfer electric charge carriers. The CCD image sensor has drawbacks such as complicated driving method, high power consumption, and large number of mask steps. Accordingly, it is difficult to dispose a signal processing circuit inside a CCD chip.

The CMOS image sensor may include a plurality of unit pixels each including a photodiode (PD) and a MOS transistor. The CMOS image sensor may form an image by detecting a signal in a switching method.

The CMOS image sensor has advantages such as low manufacturing cost, low power consumption, and relatively easy integration with a peripheral circuit chip. The CMOS image sensor may be manufactured using the CMOS manufacturing technique. Accordingly, it is relatively easy to integrate the CMOS image sensor with a peripheral system that amplifies and processes signals. Due to easy integration, a manufacture cost thereof is relatively low. Further, a processing speed is fast, and power consumption is as low as about one percent of the CCD image sensor.

Pixels of an image sensor may be divided into a passive type and an active type. The passive type pixel has no buffer that serves as an active element. That is, a photodiode generates an electrical signal and transmits the generated signal along a vertical line when a horizontal selection signal is activated. Accordingly, the passive type pixel cannot perform a signal amplification function or a signal reduction minimization function. The active type pixel has a buffer that serves as an active element. The buffer has characteristics of high input impedance and low output impedance. Due to such characteristics of the buffer, signal reduction operation may be minimized even when an electrical signal is supplied with high output impedance. Further, a signal can be easily transferred without any loss even when a receiving terminal receives an electric signal with the input impedance.

A unit pixel of a typical passive type image sensor may include a photodiode, a transfer transistor, a reset transistor, a drive transistor, and a select transistor. The photodiode receives light and generates photocharges. The transfer transistor transfers the photocharges generated by the photodiode. The reset transistor sets a node potential to a desired value and emits the photocharges in order to perform a reset operation. The drive transistor serves as a source follower buffer amplifier. The select transistor performs addressing through switching.

A passive type image sensor, however, has disadvantages in which an output signal of the unit pixel is reduced in size by about 20% due to the body effect of the drive transistors.

In order to eliminate such a drawback, many studies have been made to exclude a drive transistor from a unit pixel of a passive type image sensor.

U.S. Pat. No. 6,975,356 discloses a passive type image sensor having no drive transistor.

FIG. 1 is a circuit diagram that illustrates a passive type image sensor of U.S. Pat. No. 6,975,356.

As illustrated in FIG. 1, the image sensor includes transfer gates 10, 12, 14, and 16 and photodiodes 2, 4, 6, and 8 in photosensitive sections of respective pixels. A source electrode of each transfer gate is respectively connected to a cathode of corresponding photodiode. The image sensor further includes source junction capacitors 18, 20, 22, and 24 of floating diffusion regions between drain electrodes of the transfer gates 10, 12, 14, and 16 and source electrodes of horizontal selection switches 26, 28, 30, and 32. Such source junction capacitors 18, 20, 22, and 24 are used as detection capacitance.

Gate electrodes of the transfer gates 10 and 12 are connected to a transfer gate control line 62. Gate electrodes of the transfer gates 14 and 16 are connected to a transfer gate control line 70. Gate electrodes of the horizontal selection switches 26 and 28 are connected to a horizontal selection line 64. Gate electrodes of the horizontal selection switches 30 and 32 are connected to a horizontal selection line 72.

The image sensor further includes reset switches 34, 36, 38, and 40 for charging the detection capacitors 18, 20, 22, and 24 to a reset level. The reset switches 34, 36, 38, and 40 are respectively connected to the detection capacitors 18, 20, 22, and 24. Drain electrodes of the reset switches 34 and 36 are connected to a reset voltage supply line 58 to which a reset voltage is supplied. Source electrodes of the reset switches 34 and 36 are respectively connected to the detection capacitors 18 and 20, and gate electrodes of the reset switches 34 and 36 are connected to a reset control signal line 60. Drain electrodes of the reset switches 38 and 40 are connected to a reset voltage supply line 66 to which the reset voltage is supplied. Source electrodes of the reset switches 38 and 40 are respectively connected to the detection capacitors 22 and 24. The gate electrodes of the reset switches 38 and 40 are connected to a reset control signal line 68.

The horizontal selection switches 26 and 30 are connected to a vertical selection line 54. The horizontal selection switches 28 and 32 are connected to a vertical selection line 56. Electric charge amplifiers 41 and 43 are respectively connected to the vertical selection lines 54 and 56.

The passive type image sensor of FIG. 1 may cause blooming effect. That is, the passive type image sensor performs light integration operation to integrate photocharges generated by the photodiodes 2, 4, 6, and 8. When the photocharges exceed a predetermined threshold value during the light integration operation, the photocharges leak through the transfer gates 10, 12, 14, and 16 and the horizontal selection switches 26, 28, 30, and 32. Such leaked photocharges adversely affect adjacent pixels and it causes a blooming effect.

FIG. 2 is a circuit diagram that illustrates an image sensor configured to prevent a blooming effect, and particularly, an active type image sensor disclosed in U.S. Pat. No. 7,385,272.

As illustrated in FIG. 2, a transfer gate 220 is disposed between a cathode of a photodiode 210 and a floating diffusion region 240. A gate of a source follower 260 and a current transport terminal of a reset transistor 230 are connected to the floating diffusion region 240. Another current transport terminal of the reset transistor 230 is coupled to a current transport terminal of the source follower 260. A voltage selection circuit 110 is coupled to the transfer gate 220.

The active type image sensor of FIG. 2 sets a voltage of the gate electrode of the transfer gate 220 to an intermediate value while the photodiode 210 integrates photocharges in order to prevent the blooming effect. Accordingly, the active type image sensor needs a voltage selection circuit 110. Such hardware requirement not only significantly increases a cost of the image sensor but also reduces a fill factor of the image sensor.

SUMMARY

Embodiments relate to a passive type image sensor excluding a drive transistor and a method for operating the same.

In accordance with embodiments, a passive type image sensor includes at least one of the following: a photoelectric conversion section configured to receive light and integrate electric charges; a transfer section configured to transmit the integrated electric charges; an output section configured to received integrated electric charges from the transfer section and amplify and output the amplified electric charges; and an electric charge discharging section configured to discharge the electric charges flowing from the photoelectric conversion section to a common node through the transfer section while integrating the electric charge integration in the photoelectric conversion section.

The electric charge discharging section may include: a first electric charge discharge switching element connected to the output section; and a second electric charge discharge switching element connected to a common node that is disposed between the first electric charge discharge switching element and the transfer section.

The electric charge discharging section may discharge the electric charges when the first electric charge discharge switching element is turned off and the second electric charge discharge switching element is turned on.

The first electric charge discharge switching element and the second electric charge discharge switching element may include at least one transistor. The transistor of the second electric charge discharge switching element may be connected in a diode-connection fashion. The output section may include: a reset switching element configured to reset the photoelectric conversion section, and an amplification element configured to amplify the electric charges from the photoelectric conversion section. The photoelectric conversion section may include a photodiode, and the transfer section and the electric charge discharging section include at least one transistor.

In accordance with embodiments, a passive type image sensor includes at least one of the following: a first photosensitive pixel, a second photosensitive pixel, an output section, and an electric charge discharging section.

The first photosensitive pixel includes a first photoelectric conversion section for receiving light and integrating electric charges and a first transfer section for transmitting the integrated electric charges to a common node. The second photosensitive pixel includes a second photoelectric conversion section for receiving light and integrating electric charges and a second transfer section for transmitting the integrated electric charges to the common node.

The output section amplifies the electric charges from the first photoelectric conversion section and/or the second photoelectric conversion section and outputs amplified electric charges through the common node.

The electric charge discharging section discharges the electric charges flowing from the first photoelectric conversion section or the second photoelectric conversion section to the common node through the transfer section while integrating the electric charges in the first photoelectric conversion section or the second photoelectric conversion section.

The electric charge discharging section may include a first electric charge discharge switching element connected to the output section, and a second electric charge discharge switching element connected to the common node between the first electric charge discharge switching element and the transfer section.

The electric charge discharging section may discharge the electric charges when the first electric charge discharge switching element is turned off and the second electric charge discharge switching element is turned on.

The first electric charge discharge switching element and the second electric charge discharge switching element may include at least one transistor. The second electric charge discharge switching element may be connected in a diode connection fashion.

The output section may include: a reset switching element configured to reset the first photoelectric conversion section and the second photoelectric conversion section; and an amplification element configured to amplify the electric charges from the first photoelectric conversion section and the second photoelectric conversion section.

The first photoelectric conversion section and the second photoelectric conversion section may include photodiodes, and the first transfer section, the second transfer section, and the electric charge discharging section include at least one transistor.

In accordance with embodiments, a method of operating a passive type image sensor including a photoelectric conversion element, a transfer transistor for transmitting electric charges in the photoelectric conversion element to a common node, a first anti-blooming transistor connected to the common node, a second anti-blooming transistor having a first terminal connected to the common node, and an output section connected to a second terminal of the second anti-blooming transistor, the method including one of the following: integrating electric charges in the photoelectric conversion element, discharging a current flowing through the transfer transistor while integrating the electric charges in the photoelectric conversion element by activating the first anti-blooming transistor and inactivating the second anti-blooming transistor, outputting a voltage on the common node as a reference voltage, and outputting electric charges in the photoelectric conversion element as a sensing voltage by inactivating the first anti-blooming transistor, activating the second anti-blooming transistor, and activating the transfer transistor.

The method may further include resetting the photoelectric conversion element through the output section before integrating the electric charges in the photoelectric conversion element.

The output section may include: a reset switching element for resetting the photoelectric conversion element; and an amplification element for amplifying the electric charges from the photoelectric conversion element.

In accordance with embodiments, the passive type image sensor excludes a drive transistor. Since no body effect is induced, an output signal of the unit pixel is not reduced.

When electric charges are integrated excessively during the electric charge integration operation of the photoelectric conversion element, the excessive electric charges are discharged according to the embodiments of the present invention. That is, anti-blooming effect is induced. Further, to the image sensor according to the embodiments does not require additional hardware such as the voltage selection circuit for inducing such anti-blooming effect. Accordingly, a manufacturing cost thereof does not increase. Moreover, since the image sensor according to the embodiments includes multiple photoelectric conversion elements coupled to the common node, the fill factor is enhanced.

DRAWINGS

Figure 1:
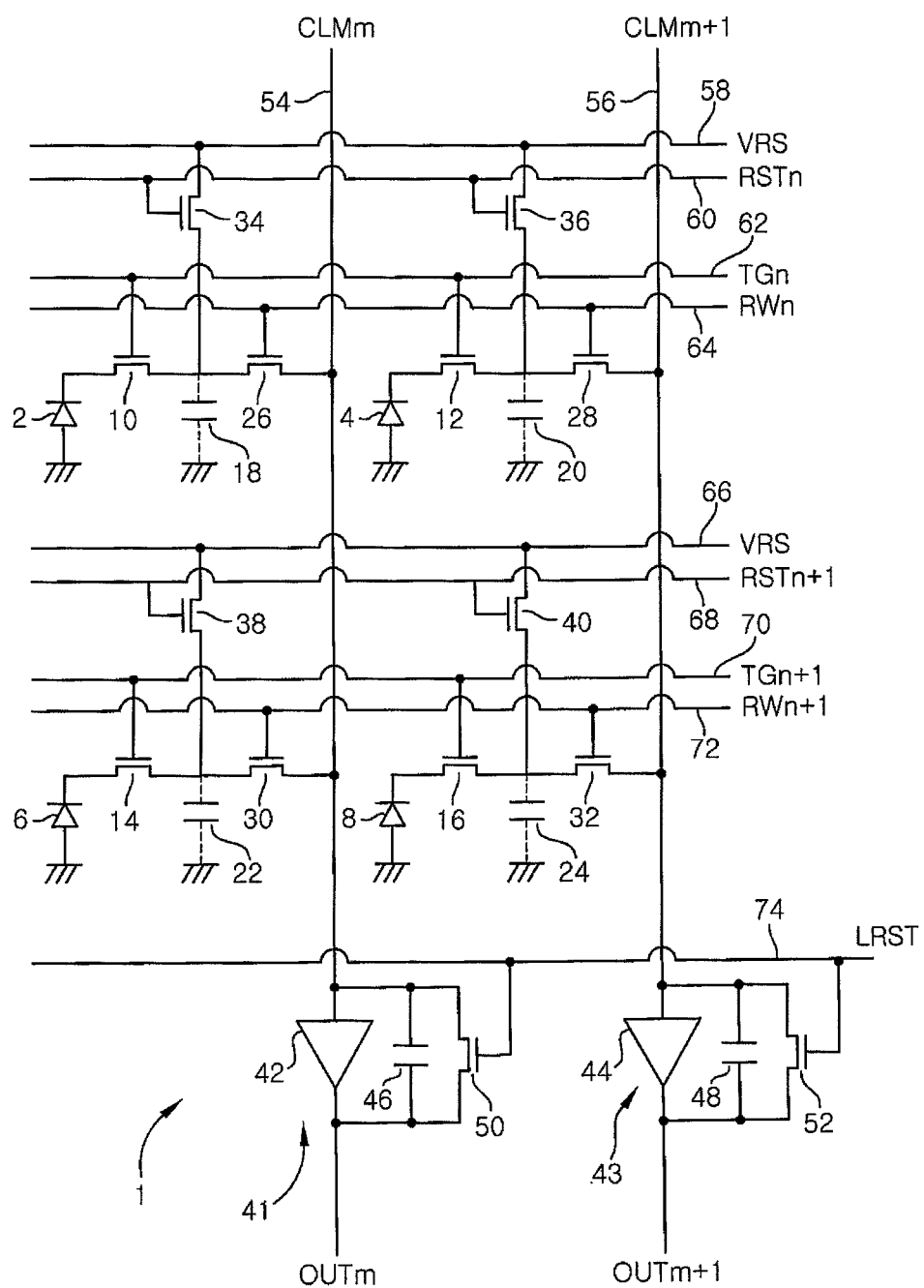
FIG. 1 is a circuit diagram that illustrates a passive type image sensor including no drive transistor.
Figure 2:
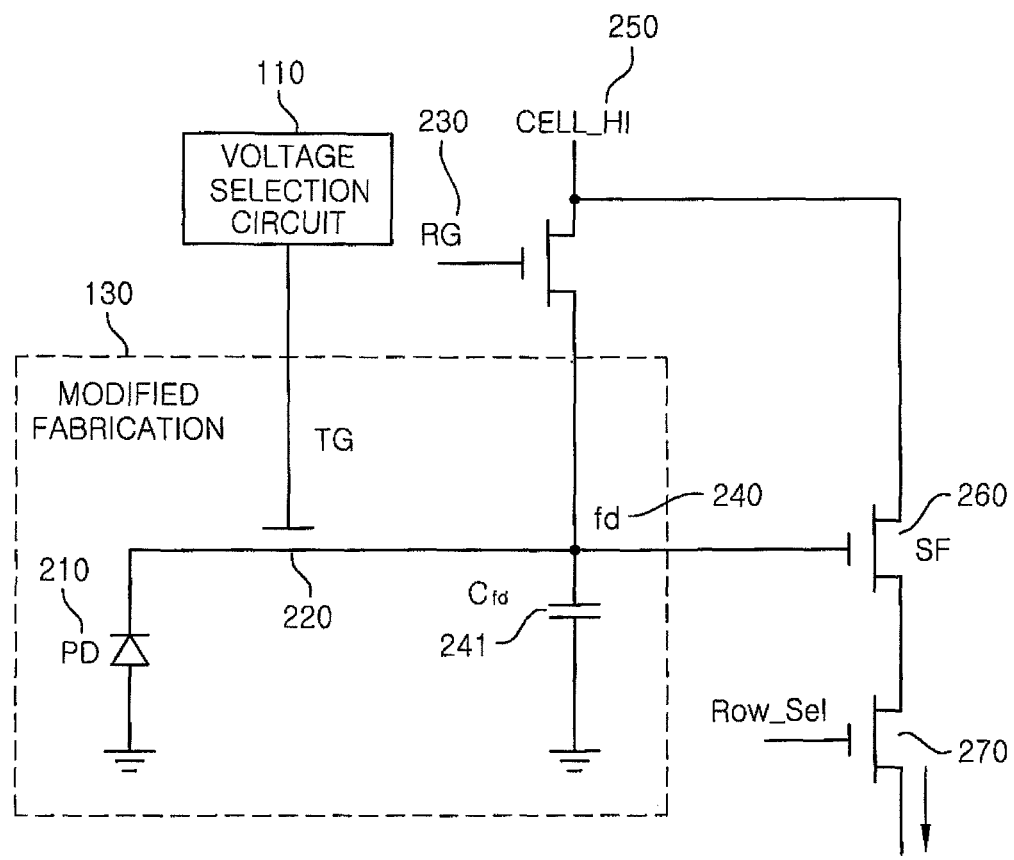
FIG. 2 is a circuit diagram that illustrates an active type image sensor configured to prevent blooming.
Figure 3:
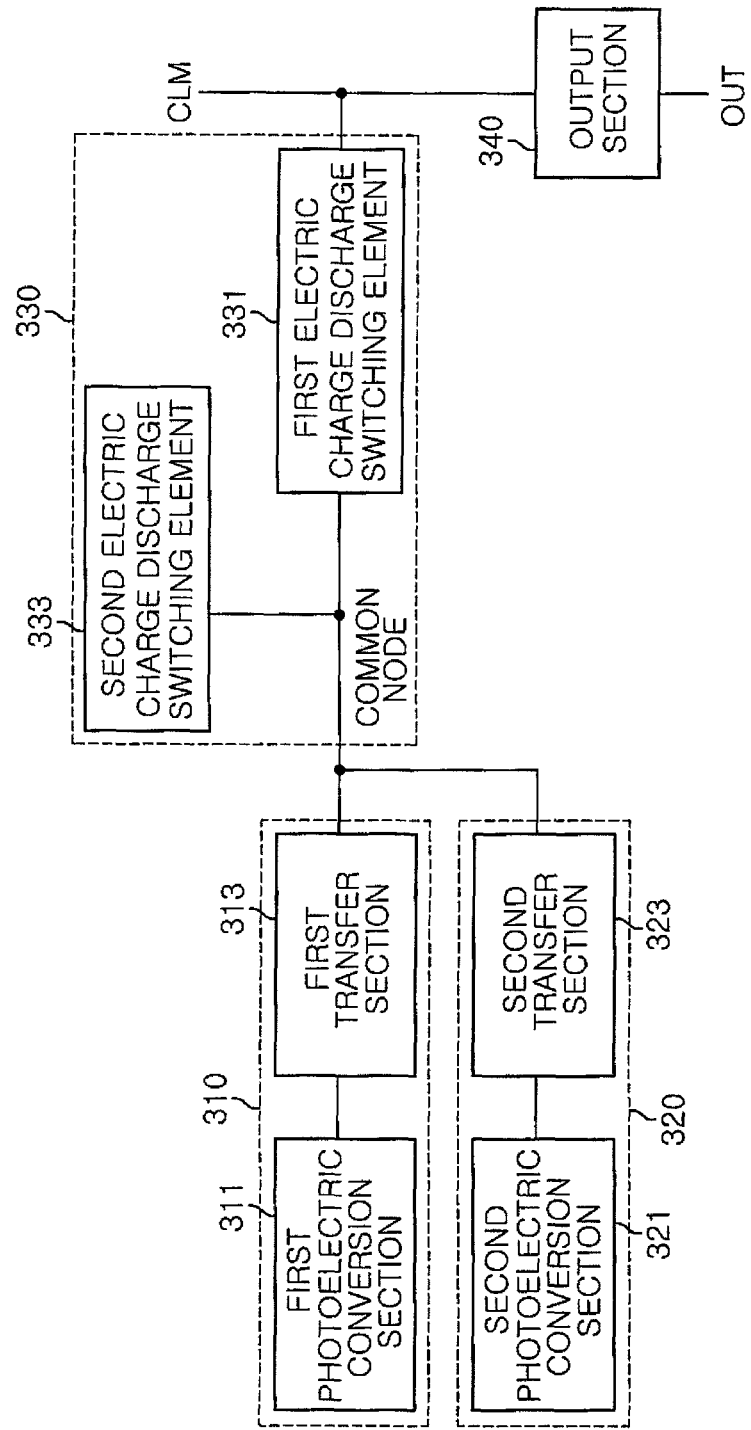

Example FIG. 3 is a diagram that illustrates a passive type image sensor in accordance with embodiments.

Figure 4:
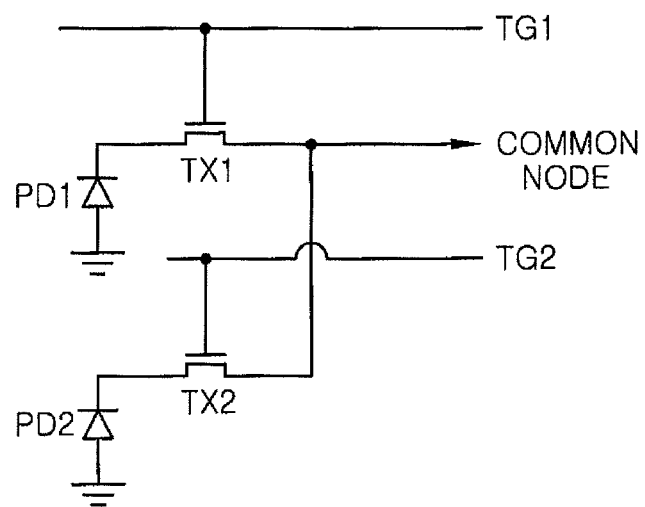

Example FIG. 4 is a circuit diagram that illustrates a photoelectric conversion section and a transfer section in a passive type image sensor in accordance with embodiments.

Figure 5:
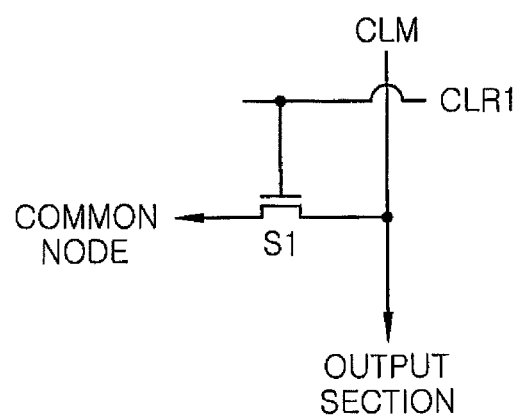

Example FIG. 5 is a circuit diagram that illustrates a first electric charge discharge switching element of an electric charge discharging section in a passive type image sensor in accordance with embodiments.

Figure 6:
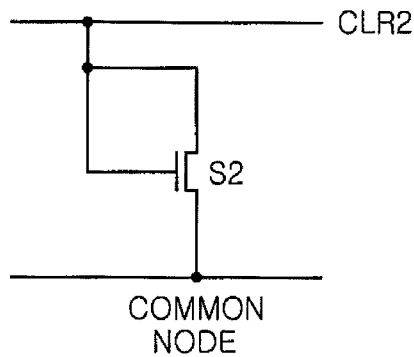

Example FIG. 6 is a circuit diagram that illustrates a second electric charge discharge switching element of the electric charge discharging section in a passive type image sensor in accordance with embodiments.

Figure 7:
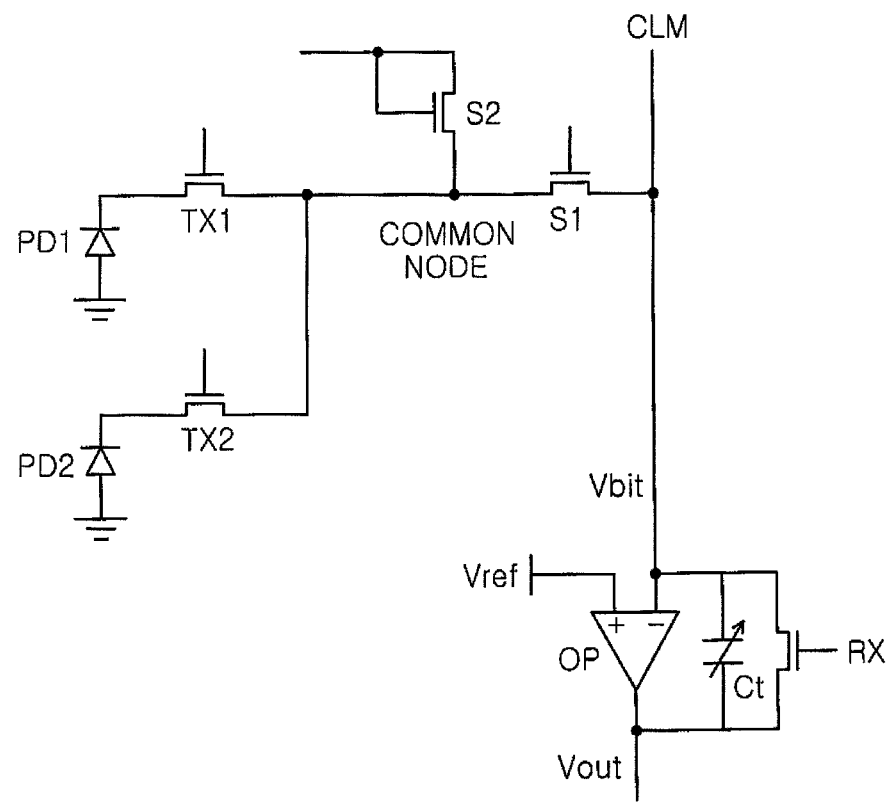

Example FIG. 7 is a circuit diagram that illustrates a passive type image sensor in accordance with embodiments.

Figure 8:
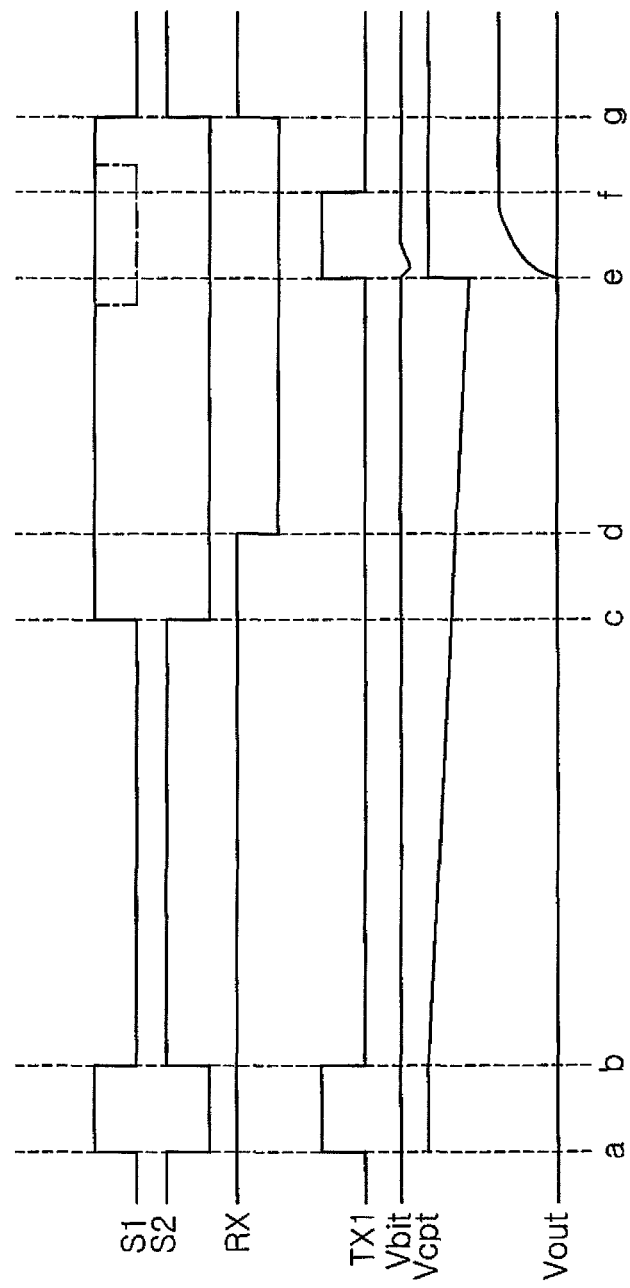

Example FIG. 8 is a signal waveform diagram for describing a method of operating a passive type image sensor in accordance with embodiments.

Figure 9:
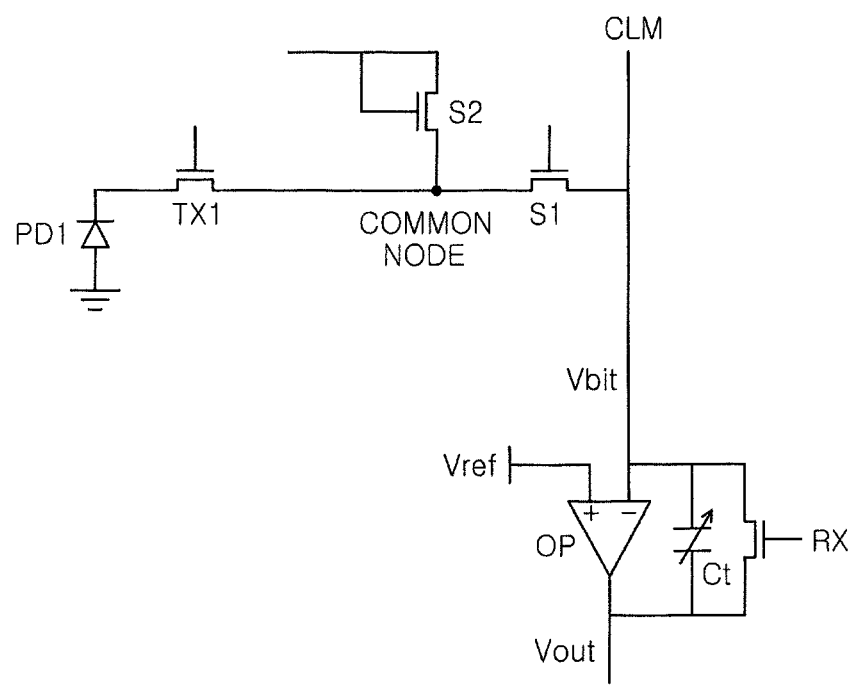

Example FIG. 9 is a circuit diagram that illustrates a unit pixel of a passive type image sensor in accordance with embodiments.

DESCRIPTION

Hereinafter, an image sensor in accordance with embodiments and a method for operating the same will be described with reference to the annexed drawings.

Example FIG. 3 is a diagram that illustrates a passive type image sensor in accordance with embodiments.

As illustrated in example FIG. 3, the passive type image sensor may include a first photosensitive pixel 310, a second photosensitive pixel 320, an electric charge discharging section 330, and an output section 340. The first photosensitive pixel 310 may include a first photoelectric conversion section 311 and a first transfer section 313. The first photoelectric conversion section 311 may receive light and integrate electric charges. The first transfer section 313 may perform an operation of transferring the integrated electric charges to a common node or an operation of preventing the electric charges from being transferred to the common node during the charge integration.

The second photosensitive pixel 320 may include a second photoelectric conversion section 321 and a second transfer section 323. The second photoelectric conversion section 321 may receive light and integrate electric charges. The second transfer section 323 may perform an operation of transferring the integrated electric charges to the common node or an operation of preventing the electric charges from being transferred to the common node during the charge integration. The first transfer section 313 and the second transfer section 323 may output the electric charges integrated in the first photoelectric conversion section 311 and the second photoelectric conversion section 321 at different timings, respectively.

The electric charge discharging section 330 may discharge the electric charges flowing from the first photoelectric conversion section 311 and/or the second photoelectric conversion section 321 to the common node through the first transfer section 313 and/or the second transfer section 323 during the electric charge integration operation in which the first photoelectric conversion section 311 and/or the second photoelectric conversion section 321 receive light and integrate the electric charges, thereby inducing the anti-blooming effect.

The electric charge discharging section 330 may include a first electric charge discharge switching element 331 and a second electric charge discharge switching element 332. The first electric charge discharge switching element 331 may transfer or block the electric charges from the first transfer section 313 and the second transfer section 323 to the output section 340 based on a switching state thereof. The second electric charge discharge switching element 333 may selectively discharge the electric charges transferred from the first transfer section 313 and the second transfer section 323 to the common node based on its switching state.

The output section 340 may reset the first photoelectric conversion section 311 and the second photoelectric conversion section 321. Furthermore, the output section 340 may amplify the electric charges from the first photoelectric conversion section 311 and the second photoelectric conversion section 321 through the common node and the electric charge discharging section 330 and output the amplified electric charges.

As illustrated in example FIG. 3, a passive type image sensor includes a pair of photoelectric conversion sections 311, 321 and a pair of transfer sections 313, 323 coupled to the common node. However, embodiments are not limited thereto. For example, an image sensor in accordance with embodiments may include more than three photoelectric conversion sections and more than three transfer sections coupled to the common node.

As illustrated in example FIG. 3, reference alphabet CLM represents a vertical selection line of the image sensor.

Hereinafter, a method of operating the passive type image sensor illustrated in example FIG. 3 will be described. For convenience of description and ease of understanding, a description will be made in connection with five time periods. It would be understood that two or more adjacent time periods may be unified as a single time period at the time of driving.

First Time Period

An electric charge transfer operation of the first transfer section 313 and/or the second transfer section 323 is activated. Further, an electric charge discharging operation of the electric charge discharging section 330 is inactivated, and a reset operation of the output section 340 is activated. When the electric charge discharging operation is inactivated, a switching control operation is performed. In the switching control operation, the first electric charge discharge switching element 331 transfers electric charges and the second electric charge discharge switching element 333 does not transfer electric charges.

During the first time period, the integrated electric charges of the first photoelectric conversion section 311 or/and the second photoelectric conversion section 321 pass through the first transfer section 313 or/and the second transfer section 323 and the first electric charge discharge switching element 331. Then, the electric charges are discharged to the output section 340. As a result, the first photoelectric conversion section 311 or/and the second photoelectric conversion section 321 are reset. That is, the first photosensitive pixel 310 and the second photosensitive pixel 320 are refreshed.

Second Time Period

An electric charge blocking operation of the first transfer section 313 or/and the second transfer section 323 is activated. Further, an electric charge integration operation of the first photoelectric conversion section 311 or/and the second photoelectric conversion section 321 is activated, and an electric charge discharging operation of the electric charge discharging section 330 is activated. Here, the electric charge discharging operation may be an anti-blooming operation. When the electric charge discharging operation is activated, a switching control operation is performed. In this switching control operation, the first electric charge discharge switching element 331 blocks the electric charges, and the second electric charge discharge switching element 333 discharges the electric charges.

During the second time period, the first photoelectric conversion section 311 or/and the second photoelectric conversion section 321 integrate photocharges. If the integrated photocharges of the first photoelectric conversion section 311 or/and the second photoelectric conversion section 321 exceed a predetermined threshold value, the excessive electric charges may leak to the common node through the first transfer second 313 or/and the second transfer section 323. In more detail, the excessive electric charges may leak to the common node even when the transport function of the first transfer section 313 or/and the second transfer section 323 is inactivated, or even when the electric charge blocking operation is performed.

However, the leakage electric charges flow from the common node toward the second electric charge discharge switching element 333 because the electric charge discharging operation of the electric charge discharging section 330 is activated. Then, the leakage electric charges are discharged through the second electric charge discharge switching element 333. Therefore, the anti-blooming effect is induced.

Third Time Period

An electric charge blocking operation of the first transfer section 313 or/and the second transfer section 323 remains activated, and an electric charge discharging operation of the electric charge discharging section 330 is inactivated.

The third time period is to prepare outputting the photocharges integrated in the first photoelectric conversion section 311 or/and the second photoelectric conversion section 321. During the third time period, the first photoelectric conversion section 311 or/and the second photoelectric conversion section 321 can continue to integrate photocharges.

Fourth Time Period

The electric charge blocking operation of the first transfer section 313 or/and the second transfer section 323 remains activated, and an electric charge discharging operation of the electric charge discharging section 330 remains inactivated.

The fourth time period is a period that the output section 340 outputs a voltage at the common node as a reference voltage.

Fifth Time Period

The electric charge transfer operation of the first transfer section 313 or/and the second transfer section 323 is activated, and an electric charge discharging operation of the electric charge discharging section 330 remains inactivated.

During the fifth time period, the photocharges integrated in the first photoelectric conversion section 311 or/and the second photoelectric conversion section 321 are transferred to the common node. Then, the photocharges are transferred to the output section 340 through the first electric charge discharge switching element 331.

Sixth Time Period

The electric charge transfer operation of the first transfer section 313 or/and the second transfer section 323 is inactivated, and an electric charge discharging operation of the electric charge discharging section 330 remains inactivated.

During the sixth time period, the output section 340 amplifies the voltage corresponding to the photocharges transferred from the first photoelectric conversion section 311 or/and the second photoelectric conversion section 321 to the common node and outputs the amplified voltage as a sensing voltage.

After outputting the amplified voltage from the output section 340, sampling may be performed using the reference voltage and the sensing voltage output from the output section 340. The reason for reading the sensing voltage during the fifth time period is to avoid a voltage variation error that may occur due to the switching operation of the first transfer section 311 or/and the second transfer section 321.

Example FIG. 4 illustrates a circuit diagram that illustrates a photoelectric conversion section and a transfer section in a passive type image sensor according to embodiments of the invention.

The first photoelectric conversion section 311 and the second photoelectric conversion section 321 may include one or more photodiodes. The first and second transfer sections 313 and 323 may include more than one transistor. For example, the first and second photoelectric conversion sections 311 and 321 according to the embodiment include a single photodiode, and the first transfer section 313 and the second transfer section 323 include a single transistor, as illustrated in FIG. 4.

As illustrated in example FIGS. 3 and 4, the first photoelectric conversion section 311 may include a first photodiode PD 1. The first transfer section 313 may include a first transfer transistor TX1. The first transfer transistor TX1 may include a source connected to a cathode of the first photodiode PD1, a gate connected to a first transfer gate control line TG1, and a drain connected to the common node.

The second photoelectric conversion section 321 may include a second photodiode PD2. The second transfer section 323 may include a second transfer transistor TX2. The second transfer transistor TX2 may include a source connected to a cathode of the second photodiode PD2, a gate connected to a second transfer gate control line TG2, and a drain connected to the common node.

As illustrated in example FIG. 5 illustrates a circuit diagram of a first electric charge discharge switching element of an electric charge discharging section in a passive type image sensor in accordance with embodiments.

The first electric charge discharge switching element 331 may include one or more transistors. For example, the first electric charge switching element 331 in accordance with embodiments includes a single transistor, as illustrated in example FIG. 5.

As illustrated in example FIGS. 3 and 5, the first electric charge discharge switching element 331 may include a first anti-blooming transistor S1 which has a source connected to the common node, a gate connected to a first anti-blooming control line CLR1, and a drain connected to a vertical selection line CLM.

Example FIG. 6 is a circuit diagram that illustrates a second electric charge discharge switching element of an electric charge discharging section in a passive type image sensor in accordance with embodiments.

The second electric charge discharge switching element 333 may include one or more transistors. For example, the second electric discharge switching element 333 according to the embodiments includes a single transistor, as illustrated in example FIG. 6.

As illustrated in example FIGS. 3 and 6, the second electric charge discharge switching element 333 may include a second anti-blooming transistor S2. The second anti-blooming transistor S2 may include a source, a drain, and a gate. The source is connected to the common node and the drain and the gate are commonly connected to a second anti-blooming control line CLR2. That is, the second anti-blooming transistor S2 may be connected between the common node and the second anti-blooming control line CLR2 in a diode-connection fashion. In such configuration, the number of metal wires can be reduced. Accordingly, the fill factor thereof is enhanced.

Example FIG. 7 is a circuit diagram that illustrates a passive type image sensor in accordance with embodiments.

As illustrated in example FIG. 7, the passive type image sensor may include a first photodiode PD1, a second photodiode PD2, a first transfer transistor TX1, a second transfer transistor TX2, a first anti-blooming transistor S1, a second anti-blooming transistor S2, an amplifier OP, a reset transistor RX, and a feedback capacitor Ct. The first and second photodiode PD1 and PD2 may serve as a photoelectric conversion element that receives light and generates photocharges. The first and second transfer transistors TX1 and TX2 may transfer or block the photocharges integrated in the first and second photodiodes PD1 and PD2 according to the switch states thereof. The first anti-blooming transistor S1 may transfer the electric charges at the common node to the amplifier OP as an output element.

The first anti-blooming transistor S1 may block the electric charges transferred to amplifier OP at the common node. The second anti-blooming transistor S2 may serve as a switching element. The second anti-blooming transistor S2 may discharge the electric charges at the common node according to a switching state thereof. The amplifier OP may amplify and output a current output through the second anti-blooming transistor S2. The reset transistor RX serves as a reset switching element. The reset transistor RX may reset the first photodiode PD1 and the second photodiode PD2. The feedback capacitor Ct may adjust the gain of the amplifier OP.

The first transfer transistor TX1 may include a source connected to a cathode of the first photodiode PD1, a gate connected to a first transfer gate control line, and a drain connected to the common node. The second transfer transistor TX2 may include a source connected to a cathode of the second photodiode PD2, a gate connected to the second transfer gate control line, and a drain connected to the drain of the first transfer transistor TX1 and the common node.

The first anti-blooming transistor S1 may include a source connected to the common node, a gate connected to the first anti-blooming control line, and a drain connected to the vertical selection line CLM. The second anti-blooming transistor S2 may include a source, a drain, and a gate. The source is connected to the common node. The drain and gate commonly are connected to the second anti-blooming control line.

As illustrated in example FIG. 7, the image sensor includes two photodiodes PD1 and PD2 and two transfer transistors TX1 and TX2 coupled to the common node. However, the present invention is not limited thereto. An image sensor in accordance with embodiments may include three or more photodiodes and transfer transistors coupled to the common node.

The first photodiode PD1 and the first transfer transistor TX1 may form a first photosensitive pixel. Further, the second photodiode PD2 and the second transfer transistor TX2 may constitute a second photosensitive pixel. The first and second photosensitive pixels share the first anti-blooming transistor S1 and the second anti-blooming transistor S2. Thus, the fill factor is enhanced compared to an image sensor including first and second anti-blooming transistors S1 and S2 separately connected to the first and second photosensitive pixels.

Example FIG. 8 is a signal waveform diagram for describing a method of operating a passive type image sensor in accordance with embodiments. Hereinafter, the method of operating a passive type image sensor in accordance with embodiments will be described with reference to example FIGS. 7 and 8. For convenience of description and ease of understanding, a description will be made in connection a plurality of time periods, i.e., time points a to g as illustrated in example FIG. 8. It should be noted, however, that two or more adjacent time periods may be unified as a single time period at the time of driving.

As illustrated in example FIG. 8, reference alphabet Vbit denotes an input voltage of the amplifier OP, reference alphabet Vcpt denotes a voltage of the first photodiode PD1, and reference alphabet Vout denotes an output voltage of the amplifier OP. The operation of the passive type image sensor will be described focusing on the first photosensitive pixel.

Time Period a-b

The first transfer transistor TX1 and the first anti-blooming transistor S1 are turned on. The second anti-blooming transistor S2 is turned off, and the reset transistor RX is turned on. During the a-b time period, the integrated electric charges of the first photodiode PD1 or/and the second photodiode PD2 pass through the first transfer transistor TX1 and the first anti-blooming transistor S1.

Then, the electric charges are discharged through the reset transistor RX. Accordingly, the first photodiode PD1 or/and the second photodiode PD2 are reset. That is, global reset is performed. The global reset resets the first photodiode PD1 or/and the second photodiode PD2 before the first or/and second photodiode PD1 and PD2 read the pixel value because the common node serves as a floating node.

Time Period b-c

The first transfer transistor TX1 and the first anti-blooming transistor S1 are turned off. The second anti-blooming transistor S2 is turned on, and the reset transistor RX remains turned on. During the b-c time period, the first photodiode PD1 integrates the photocharges. If the integrated photocharges exceed the predetermined threshold value of the first transfer transistor TX1, the excessive electric charge may leak to the common node through the first transfer transistor TX1 although the first transfer transistor TX1 is turned off.

The leakage electric charges flow, however, from the common node to the second anti-blooming transistor S2 because the second anti-blooming transistor S2 is turned on. Then, the leakage electric charges are discharged through the second anti-blooming transistor S2. Accordingly, the anti-blooming effect is induced. Here, when a negative potential is applied to the gate of the first anti-blooming transistor S1 through the first anti-blooming control line although the first anti-blooming transistor S1 is turned off, the electric charge blocking effect may be improved. Accordingly, the anti-blooming effect may be further improved.

Time Period c-d

The first transfer transistor TX1 remains turned off, and the first anti-blooming transistor S1 is turned on. The second anti-blooming transistor S2 is turned off, and the reset transistor RX remains turned on. The c-d time period is to prepare outputting the photocharges integrated in the first photodiode PD1 or/and the second photodiode PD2. During the c-d time period, the first photodiode PD1 may continue to integrate photocharges.

Time Period d-e

The first transfer transistor TX1 remains turned off, and the first anti-blooming transistor S1 remains turned on. The second anti-blooming transistor S2 remains turned off, and the reset transistor RX is turned off. During the d-e time period, the feedback capacitor Ct is activated so as to read the output of the photocharges integrated in the first photodiode PD1. Furthermore, the amplifier OP outputs the voltage at the common node as the reference voltage. At this time, if the first transfer transistor TX1 remains turned off, the voltage of the vertical selection line CLM is fixed. Accordingly, the output value of the amplifier OP is fixed too.

Time Period e-f

The first transfer transistor TX1 is turned on, and the first anti-blooming transistor S1 remains turned on. The second anti-blooming transistor S2 remains turned off, and the reset transistor RX remains turned off. During the e-f time period, the integrated photocharges are transferred from the first photodiode PD1 to the amplifier OP through the first anti-blooming transistor S1.

Time Period f-g

The first transfer transistor TX1 is turned off, and the first anti-blooming transistor S1 remains turned on. The second anti-blooming transistor S2 remains turned off, and the reset transistor RX remains turned off. During The f-g time period, the voltage corresponding to the output of the photocharges integrated in the first photodiode PD1 is read. Then, the amplifier OP amplifies the voltage at the common node and outputs the amplified voltage as the sensing voltage.

Thereafter, sampling may be performed using the reference voltage and the sensing voltage after outputting the amplified voltage. In order to prevent the voltage variation error, the sampling is performed in the f-g time period rather than the e-f time period. The voltage variation error may occur due to the switching operation of the first transfer transistor TX1.

As the dashed dot line of example FIG. 8 indicates, the first anti-blooming transistor S1 may remain in an off state during the e-f time period. For example, the first anti-blooming transistor S1 may be turned off before the first transfer transistor TX1 is turned on, and the first anti-blooming transistor S1 may be turned on after the first transfer transistor TX1 is turned off. In this case, the photocharges integrated in the first photodiode PD1 are transferred to the common node. At this time, the common node is used as the floating diffusion region. Thus, the photocharges at the common node are transferred and output to the amplifier OP.

An operation of the second photosensitive pixel including the second photodiode PD2 and the second transfer transistor TX2 is the same as or similar to the operation of the first photosensitive pixel. The first transfer transistor TX1 and the second transfer transistor TX2 are controlled at different timings to respectively output the photocharges integrated in the first photodiode PD1 and the second photodiode PD2. Thus, a detailed description on the operation of the second photosensitive pixel will be omitted.

Example FIG. 9 is a circuit diagram that illustrates a unit pixel in a passive type image sensor according to embodiments of the invention.

As illustrated in example FIG. 9, a unit pixel of the passive type image sensor may include a first transfer transistor TX1, a first anti-blooming transistor S1, a second anti-blooming transistor S2. The first transfer transistor TX1 may include a source connected to a cathode of the first photodiode PD1 and a gate connected to the first transfer gate control line. The first anti-blooming transistor S1 may include a source commonly connected to the drain of the first transfer transistor TX1 and the source of the second anti-blooming transistor S2, a gate connected to the first anti-blooming control line, and a drain connected to the vertical selection line. The second anti-blooming transistor S2 may include a source connected to the drain of the first transfer transistor TX1 and the source of the first anti-blooming transistor S1, and a drain and a gate commonly connected to the second anti-blooming control line.

Unlike the unit pixel of the passive type image sensor of example FIG. 7, the passive type image sensor of example FIG. 9 excludes the second photodiode PD2 and the second transfer transistor TX2. That is, the passive type image sensor of example FIG. 9 may perform anti-blooming although the passive type image sensor includes a single photodiode and a single transistor coupled to the common node.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A passive type image sensor comprising:
   a photoelectric conversion section configured to receive light and integrate electric charges;
   a transfer section configured to transmit the integrated electric charges;
   an output section configured to receive integrated electric charges from the transfer section, amplify the received electric charges, and output the amplified electric charges; and
   an electric charge discharging section configured to activate a first anti-blooming transistor and inactivate a second anti-blooming transistor, wherein the first anti-blooming transistor and the second anti-blooming transistor are configured to discharge the electric charges flowing from the photoelectric conversion section to a common node through the transfer section while integrating the electric charges in the photoelectric conversion section.

2. The passive type image sensor of claim 1, wherein:
   the first anti-blooming transistor is comprised in a first electric charge discharge switching element connected to the output section; and
   the second anti-blooming transistor is comprised in a second electric charge discharge switching element connected to a common node that is disposed between the first electric charge discharge switching element and the transfer section.

3. The passive type image sensor of claim 2, wherein the electric charge discharging section discharges the electric charges when the first electric charge discharge switching element is turned off and the second electric charge discharge switching element is turned on.

4. The passive type image sensor of claim 3, wherein the first electric charge discharge switching element and the second electric charge discharge switching element each include at least one transistor.

5. The passive type image sensor of claim 4, wherein the second electric charge discharge switching element is connected in a diode-connection fashion.

6. The passive type image sensor of claim 1, wherein the output section comprises:
   a reset switching element configured to reset the photoelectric conversion section; and
   an amplification element configured to amplify the electric charges from the photoelectric conversion section.

7. The passive type image sensor of claim 1, wherein:
the photoelectric conversion section comprises a photodiode; and
the transfer section and the electric charge discharging section comprises at least one transistor.

8. A passive type image sensor comprising:
a first photosensitive pixel configured to include a first photoelectric conversion section for receiving light and integrating electric charges and a first transfer section for transmitting the integrated electric charges to a common node;
a second photosensitive pixel configured to include a second photoelectric conversion section for receiving light and integrating electric charges and a second transfer section for transmitting the integrated electric charges to the common node;
an output section configured to amplify the electric charges from the first photoelectric conversion section and/or the second photoelectric conversion section and output amplified electric charges through the common node; and
an electric charge discharging section configured to activate a first anti-blooming transistor and inactivate a second anti-blooming transistor, wherein the first anti-blooming transistor and the second anti-blooming transistor are configured to discharge the electric charges flowing from the first photoelectric conversion section or the second photoelectric conversion section to the common node through the transfer section while integrating the electric charges in the first photoelectric conversion section or the second photoelectric conversion section.

9. The passive type image sensor of claim 8, wherein:
the first anti-blooming transistor is comprised in a first electric charge discharge switching element electrically connected to the output section; and
the second anti-blooming transistor is comprised in a second electric charge discharge switching element electrically connected to the common node between the first electric charge discharge switching element and the transfer section.

10. The passive type image sensor of claim 9, wherein the electric charge discharging section discharges the electric charges when the first electric charge discharge switching element is turned off and the second electric charge discharge switching element is turned on.

11. The passive type image sensor of claim 10, wherein the first electric charge discharge switching element and the second electric charge discharge switching element each include at least one transistor.

12. The passive type image sensor of claim 11, wherein the second electric charge discharge switching element is electrically connection in a diode connection fashion.

13. The passive type image sensor of claim 8, wherein the output section comprises:
a reset switching element configured to reset the first photoelectric conversion section and the second photoelectric conversion section; and
an amplification element configured to amplify the electric charges from the first photoelectric conversion section and the second photoelectric conversion section.

14. The passive type image sensor of claim 8, wherein the first photoelectric conversion section and the second photoelectric conversion section each include photodiodes.

15. The passive type image sensor of claim 14, wherein the first transfer section, the second transfer section, and the electric charge discharging section each include at least one transistor.

16. A method of operating a passive type image sensor, the method comprising:
integrating electric charges in a photoelectric conversion element;
discharging a current flowing through a transfer transistor while integrating the electric charges in the photoelectric conversion element by activating a first anti-blooming transistor and inactivating a second anti-blooming transistor, wherein the first anti-blooming transistor and the second anti-blooming transistor are configured to discharge electric charges flowing from the photoelectric conversion element to a common node through the transfer transistor while integrating the electric charges in the photoelectric conversion element;
outputting a voltage on a common node as a reference voltage; and then
outputting electric charges in the photoelectric conversion element as a sensing voltage by inactivating the first anti-blooming transistor, activating the second anti-blooming transistor, and activating the transfer transistor.

17. The method of claim 16, further comprising:
resetting the photoelectric conversion element through an output section.

18. The method of claim 17, wherein resetting the photoelectric conversion element through the output section occurs before integrating the electric charges in the photoelectric conversion element.

* * * * *